United States Patent [19]
Maciag

[11] 3,824,486
[45] July 16, 1974

[54] SOLID STATE SWITCHING CIRCUIT EMPLOYING A SELECTIVELY DAMPED PIEZOELECTRIC RESONATOR TO CONTROL A THYRISTOR CIRCUIT

[75] Inventor: Edmund T. Maciag, Middleburg Heights, Ohio

[73] Assignee: Vernitron Corporation, Bedford, Ohio

[22] Filed: Oct. 27, 1972

[21] Appl. No.: 301,480

[52] U.S. Cl. .................... 331/65, 310/8.3, 317/146, 317/148.5 B, 331/116
[51] Int. Cl. .............................................. H03b 5/36
[58] Field of Search ...... 331/65, 116, 185; 317/146, 317/148.5; 310/8, 8.1, 8.3, 8.4, 8.7, 9.3

[56] References Cited

UNITED STATES PATENTS

| | | | |
|---|---|---|---|
| 3,546,619 | 12/1970 | Cragg et al. | 331/116 |
| 3,601,621 | 8/1971 | Ritchie | 331/65 |
| 3,747,010 | 9/1962 | Buck | 317/146 |

*Primary Examiner*—John Kominski

[57] ABSTRACT

A compact and relatively economical high speed solid state switching circuit wherein a thyristor is controlled by an oscillator employing a selectively damped piezoelectric resonator, the piezoelectric resonator being housed within a mount that yields manual control over its damping.

5 Claims, 3 Drawing Figures

PATENTED JUL 16 1974 3,824,486

SOLID STATE SWITCHING CIRCUIT EMPLOYING A SELECTIVELY DAMPED PIEZOELECTRIC RESONATOR TO CONTROL A THYRISTOR CIRCUIT

BACKGROUND OF THE INVENTION

1. Field of the Invention

This invention relates to switching circuitry, and more particularly to solid state switching circuitry which may be manually controlled via a piezoelectric resonator to effect non-mechanical circuit closures.

2. Description of the Prior Art

There is a continuing need for switching circuits which control the application of power to a load without using moving contacts. Solid state devices such as silicon controlled rectifiers and triacs have offered a relatively good solution to these problems and a number of circuits for controlling such devices have been developed.

It is known that a triac thyristor conducts current from an alternating current source when properly activated, but the conduction of current will cease upon reversal of the alternating current flowing therethrough. In order to utilize the triac for continuous supply and control of an alternating current, one may use a triggering source operating at a relatively high repetition rate relative to the alternating current being controlled. In this way, the alternating current does not effect turn-off of the triac for any substantial period of time. To date, the oscillator driving circuits and means for controlling them have not been entirely satisfactory because they have required either too many components or provided inadequate input control.

Direct current power has frequently been controlled with silicon controlled rectifiers which can also be selectively gated into a conductive state by appropriately applied triggering impulses. In one such unidirectional current application, a monitoring circuit was developed for sensing the impact of a mechanical press via the oscillation of a piezoelectric element. In this circuit, the output of the piezoelectric element was amplified in order to effect gating of a silicon controlled rectifier which was biased to be triggered only when normal operation was exceeded. This rather limited utilization of a particular type of piezoelectric element, did effect controls over power via a switch; however, here too, considerable circuitry and element cost was involved.

SUMMARY OF THE INVENTION

The present invention provides a unique piezoelectric resonator mount for use in conjunction with oscillator circuitry to control a thyristor, in order to control switching of power to a load. The control is effected by selective dampening of the piezoelectric resonator in order to terminate operation of the oscillator and consequently remove the triggering impulse to the thyristor.

It is an object of the present invention to provide an improved solid state switching circuit.

It is another object of the present invention to provide an improved solid state switching circuit utilizing a piezoelectric element for controlling the operation of a driving oscillator.

It is another object of the present invention to provide a uniquely mounted piezoelectric resonator interconnected with an oscillator circuit to produce the control signals for application to a thyristor.

It is yet another object of the invention to control the operation of a triac by the selectively varying the Q of a piezoelectric resonator included within a driving oscillator for the triac.

In accordance with one embodiment of the invention there is provided a switching circuit for controlling the delivery of power to a load via switching means rendered conductive in response to alternating current signals, comprising oscillating means including a piezoelectric element supplying alternating current to said switching means, and means for selectively changing the characteristics of said piezoelectric element to establish the operating frequency of said oscillating means.

In accordance with another aspect of the invention there is provided unique mounting structures for the aforementioned piezoelectric element in order to controllably dampen its vibration, comprising rigidly positioned damping means located adjacent to one face of the piezoelectric element, spring means interconnecting this face to the rigidly positioned damping means, movable damping means located adjacent to the other face of the piezoelectric element and spring means interconnecting this other face to the movable damping means. The mount includes biasing means for biasing the movable damping means into a static position relative to the rigidly positioned damping means which is either in direct physical contact with the piezoelectric element or sufficiently spaced apart to permit the piezoelectric element to hang freely suspended by the spring means. Actuating means in the form of a push button or the like are provided for overcoming the biasing means in order to change the relatively damped or undamped position of the unit.

The abovementioned objects of the invention, along with the various novel features thereof will be more fully understood and appreciated from the following detailed description which is made in conjunction with the drawings.

DESCRIPTION OF THE PREFERRED EMBODIMENTS

Figure 1:
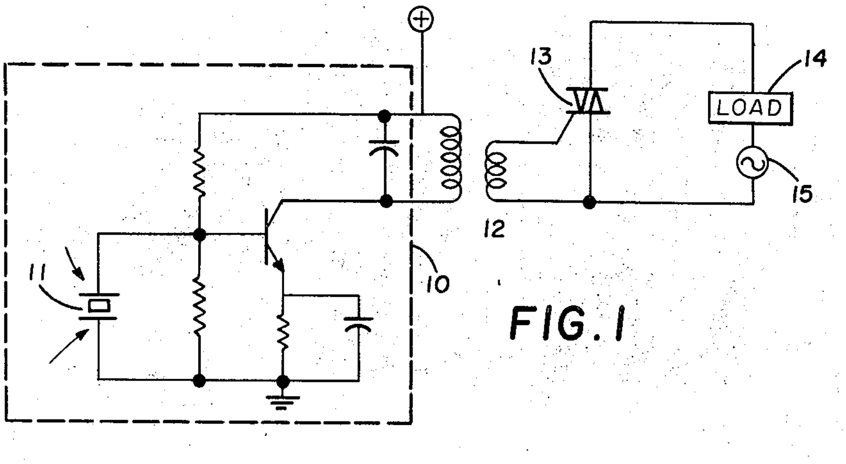
FIG. 1 is a circuit schematic illustrating the various components of one embodiment of the invention.

FIG. 1 illustrates a control circuit for the selective application of power from an alternating current source 15 to a load 14 via thyristor switching device 13. The operation of thyristor 13 is well known. This triac element responds to the application of appropriately polarized triggering impulses on its gate lead, to conduct currents of relatively high magnitude therethrough. The control pulses are applied to triac 13 via a transformer 12 having its primary supplied by oscillator circuit 10. The specific elements within the oscillator circuit may vary; however, it will be noted that the present invention lends itself particularly well to the use of a simple relatively low power single transistor amplifier whose frequency of operation is controlled by a resonant piezoelectric element 11.

For proper operation of the unit, one must adjust the transformer windings for good impedence matching if a low power oscillator is employed; however, it is a feature of this circuitry that relatively little power is needed to control the switching of considerable power through triac 13. It is of course necessary that the output levels from the oscillator 10, as transmitted via transformer 12, are of sufficient amplitude to trigger all four firing modes of the triac.

Oscillator 10 normally operates under application of a low direct voltage, at a particular frequency determined by the resonant frequency of piezoelectric resonator 11. In accordance with this invention the vibration of piezoelectric resonator 11 is damped by mechanical means in order to stop oscillation. When oscillation is stopped in this manner, power is no longer applied via transformer 12 to the gating circuit of triac 13. Triac 13 therefore stops conduction and opens the circuit between the load 14 and power supply 15.

Figure 2:
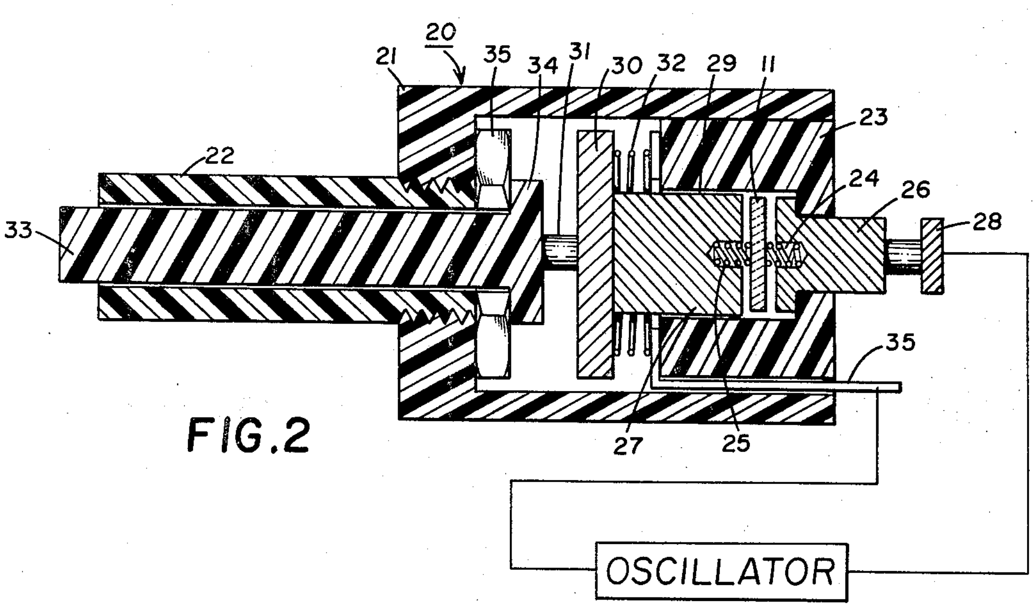
FIG. 2 is a vertical cross-section view taken through a piezoelectric resonator mount embodying the invention, for controlling a normally on solid state switch.

FIG. 2 illustrates the mount for a piezoelectric resonator disc 11 for use in a normally on switch embodying the features of this invention. The mount 20 includes a cylindrical housing 21 having a threaded recess at one end within which a tubular axial extension 22 is secured. The opposite end of housing 21 has a non-conductive cylindrical base portion 23 rigidly mounted therein.

Piezoelectric resonator disc 11 is suspended within a cylindrical cavity 29 in base portion 23 by means of axially located contact springs 24 and 25. These springs 24, 25 engage the opposing faces of resonator 11 and their remote ends are seated within conductive slugs 26 and 27 respectively. Slug 26 is rigidly affixed to the base portion 23 and projects through a narrow aperture therein to terminate in a contact element 28.

Slug 27 is mounted for sliding axially within the cylindrical cavity 29 and terminates in an enlarged shoulder 30 having an axial extension 31 projecting from the center thereof. A coiled spring 32 is compressed between the right face of shoulder 30 and the left face of base portion 23. A push button member 33 is mounted within the tubular extension 22 and prevented from leftward movement by a shoulder and nut arrangement 34, 35.

As assembled in FIG. 2, the compressed coil spring 32 forces shoulder 30 the left and thereby holds the push button 33 in its most leftward position. Under these conditions, the piezoelectric element 11 is freely suspended by contact springs 24 and 25 and is enabled to resonate freely. Appropriate contacts on resonator 11, in accordance with known practice, are conductively connected through the contact springs 24 and 25 and their associated slugs to output contacts 28 and 35.

In order to damp the vibration of piezoelectric element 11, push button 33 is depressed to the right. This further compresses coil spring 32 and forces slug 27 toward fixed slug 26. The faces of these slugs may be provided with a thin layer of rubber material, or other soft material, in order to enhance their dampening ability.

A maximum change in the resonant impedence of the piezoelectric resonator is desired when going from the damped to the undamped state. It has been found that this is achieved advantageously by simultaneously dampening both sides of the resonator. The illustrated mounting arrangement makes possible substantially equal damping on both sides while using a single fixed pad and one moving pad.

By reconsidering the illustrative circuit of FIG. 1, it will be appreciated that when the mount of FIG. 2 is in the position shown and piezoelectric element 11 is left to resonate in its normal mode, oscillator 10 will provide appropriate triggering pulses for triac 13 which will effect connection of the power supply 15 to load 14. On the other hand, when pressure is applied to push button 33 bringing the damping faces of slugs 26 and 27 into contact with the piezoelectric resonator, its Q will be considerably reduced and accordingly oscillator 10 will be stopped.

Figure 3:
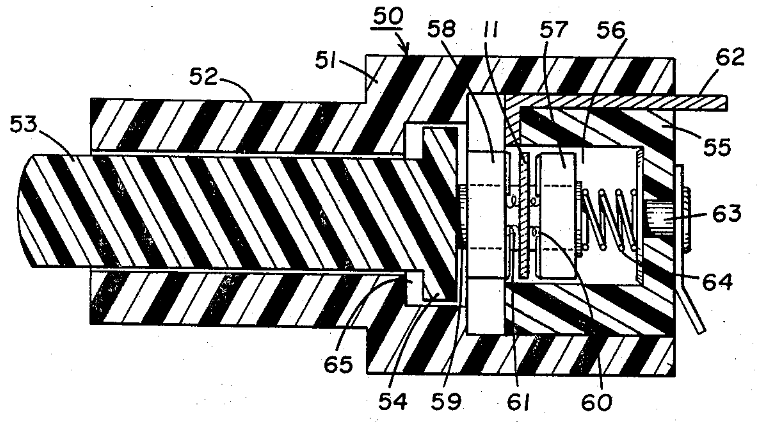
FIG. 3 is a vertical cross-section taken through a piezoelectric resonator mount embodying the invention, for controlling a normally off solid state switch.

FIG. 3 illustrates a mount 50 for a piezoelectric resonator 11, wherein the unit is held normally damped. In other words, with the mount of FIG. 3, oscillator 10 and triac 13 are held in a non-conducting mode. In order to close this switch, actuation of the push button is required. The mount 50 contains an enlarged cylindrical housing 51 and a smaller extending tubular axial extension 52. A push button 53 is axially mounted within tubular extension 52 and terminates in an enlarged shoulder 54 which bears against a shoulder 65 in housing 51 to prevent excessive movement to the left. A non-conducting base portion 55 is rigidly mounted within the right cylindrical chamber of housing 51. A cylindrical cavity within base portion 55 provides the internal housing for both piezoelectric resonator 11 and a right-hand damping pad 57. The left-hand damping pad 58 is rigidly connected to housing 51 and has an aperture therethrough for an axial projection 59 of push button 53.

Damping pads 57 and 58 are each connected to support the piezoelectric element 11 by means of contact springs 60 and 61 respectively. As discussed in connection with FIG. 2, these contact springs also provide the necessary electrical contact with resonator 11 and pick-off conductors 62 and 63 bring these electrical contacts to the outer right-hand portion of the housing. Conductor 62 is interconnected with damping pad 58 and contact spring 60, and conductor 63 is connected via coil spring 64 to damping pad 57.

The axial alignment of the various elements in FIG. 3 results in a structure which is generally urged towards maximum leftward position due to the expansion force of spring 64. Under these conditions the damping pads 57 and 58 are held in contact with piezoelectric resonator 11 and reduce its mechanical Q to a level which will prevent oscillation. When it is desired to permit piezoelectric resonator 11 to vibrate freely, push button 53 is actuated to the right and thereby presses damping pad 57 to compress spring 64 and leave resonator 11 freely suspended between contact springs 60 and 61. By reference to the illustrative circuit of FIG. 1, it is clear that the normal condition of the switch will hold the resonator 11 completely damped so that neither oscillator 10 nor triac 13 will be enabled.

A number of specific embodiments of the invention have been described and illustrated. It will be appreciated that those skilled in the art may modify particular details of these embodiments without departing from the spirit and teachings of this disclosure. All such modifications as fall within the appended claims are intended to be embraced within the invention.

What is claimed is:

1. A switching circuit for controlling the delivery of power to a load via switching means rendered conductive in response to alternating current supplied by an oscillator with a piezoelectric resonator element having a relatively thin configuration with substantially parallel faces, including means for changing the characteristics of said piezoelectric element comprising: ridigly positioned damping means located adjacent to one face of said element, spring means interconnecting said one face to said rigidly positioned damping means, movable damping means located adjacent to the other face of said element, spring means interconnecting said other face to said movable damping means, and control means for selectively changing the positions of said damping means to either physically press against the proximate faces of said piezoelectric element or freely suspend said element therebetween via said spring means.

2. A switching circuit as defined in claim 1, wherein said control means comprises biasing means for biasing said movable damping means to assume a static position relative to said rigidly positioned damping means, and actuating means for overcoming said biasing means to change the relative positions of said damping means.

3. A switching circuit as defined in claim 1, including electric contacts, wherein said spring means electrically connect energy from said piezoelectric element to said electric contacts.

4. A switching circuit as defined in claim 2, wherein said biasing means establishes a static position of said damping means in physical contact with said piezoelectric element.

5. A switching circuit as defined in claim 2, wherein said biasing means establishes a static position of said damping means which freely suspends said piezoelectric element between said damping means.

* * * * *